(12) United States Patent
Tkaczewski

(10) Patent No.: US 8,299,649 B2
(45) Date of Patent: Oct. 30, 2012

(54) PASSIVE AUDIO/VIDEO COMPONENT UNBALANCED NETWORK TO BALANCED NETWORK ADAPTER

(75) Inventor: Zbigniew A. Tkaczewski, Notre-Dame de l'Ile Perrot (CA)

(73) Assignee: Muxlab Inc., Montreal, QC (CA)

( * ) Notice: Subject to any disclaimer, the term of this patent is extended or adjusted under 35 U.S.C. 154(b) by 583 days.

(21) Appl. No.: 12/550,796

(22) Filed: Aug. 31, 2009

(65) Prior Publication Data
US 2010/0053446 A1    Mar. 4, 2010

Related U.S. Application Data

(60) Provisional application No. 61/093,932, filed on Sep. 3, 2008.

(51) Int. Cl.
*H04B 15/00* (2006.01)
(52) U.S. Cl. .......................................................... 307/89
(58) Field of Classification Search ..................... 307/89
See application file for complete search history.

*Primary Examiner* — Hal Kaplan
(74) *Attorney, Agent, or Firm* — Fasken Martineau DuMoulin LLP; Alexandre Abecassis

(57) ABSTRACT

A method and apparatus are disclosed for reducing distortions originating from a balanced link between a video transmitter connected to a first ground and a video receiver connected to a second ground, the method comprising isolating a connection to one of the first ground and the second ground and connecting the isolated connection to the other ground via a dedicated link. In particular, there is disclosed a passive circuit enabling additional channels to become available.

18 Claims, 13 Drawing Sheets

CASE: PI-1018-6 PLASMETEX IND., BOTTOM VIEW

NB: DOT INDICATES THE DIRECTION OF WINDINGS 13.3 x 7.8 x 6.8mm (D x d x H) ±0.2mm

NEOSID 28-519-39

NB: DOT INDICATES THE DIRECTION OF WINDINGS 5.84 x 3.05 x 3.05mm (D x d x H) ±0.2mm
(0.230 x 0.120 x 0.120 inch) ±0.008

28-3583-F39 NEOSID TOROIDAL CORE or equivalent

Phase 1.
Coil L1 & L2

Fill sector 0°-270° uniformly using wire 26 AWG

PASSIVE AUDIO/VIDEO COMPONENT UNBALANCED NETWORK TO BALANCED NETWORK ADAPTER

CROSS-REFERENCE AND RELATED APPLICATIONS

This patent application claims priority of U.S. Provisional patent application No. 61/093,932, entitled "Passive Audio/Video component unbalanced network to balanced network adapter", that was filed on Sep. 3, 2008, the specification of which is hereby incorporated by reference.

FIELD OF THE INVENTION

The invention relates to electronics. More precisely, the invention pertains to a passive audio/video component unbalanced network to balanced network adapter.

BACKGROUND OF THE INVENTION

Now referring to FIG. 1, there is shown a first prior art embodiment of a system for connecting a transmitter 100 to a receiver 104. The connection between the transmitter 100 and the receiver 104 is achieved using a balanced link 102.

The skilled addressee will appreciate that the transmitter 100 is connected to the ground 106 while the receiver is connected to ground 108.

Since ground 106 and ground 108 are not always and not necessary the same, a distortion voltage ΔUg is created and added to the signals being transmitted. Such system is therefore exposed to two independent sources of distortions. A first source of distortions comprises Electromagnetic Interferences (EMI), while a second source of distortions comprises "Ground Loop distortions".

Now referring to FIG. 2, there is a shown another embodiment of a system for connecting a transmitter 100 to a receiver 104 which uses a technique also referred to as "Ground Loop Isolation" (GLI) technique. This embodiment is supposed to enable the removing of harmful, audible or visible distortions from the system.

In this embodiment, a transformer 200 is provided for isolating the transmitter 100 and the receiver 104. It will be appreciated that as a result, ground loop distortions ΔUg disappear and only electromagnetic interferences remain as a source of distortion. The skilled addressee will appreciate that ground loop originated distortions are attenuated due to the presence of the transformer 200.

It will be appreciated that the transformer 200 must transmit the frequency bandwidth of the signals. As known by the skilled addressee, in the case of home theater video signals, such as 1080i/p, the required bandwidth ranges between 1 Hz to 60 MHz or more. In the case where the video signal is limited to lower resolution, such as standard video 480i, the required bandwidth between 60 Hz and 8 MHz.

It will be appreciated however that the technology being actually available does not allow to built and deploy "Ground Loop Isolation" transformers having bandwidth ranging between 1 Hz and 60 MHz and remain competitive on worldwide video markets being structured the way to remain competitive and on demand.

There is therefore a need for a method and apparatus that will overcome at least one of the above-identified drawbacks.

Features of the invention will be apparent from review of the disclosure, drawings and description of the invention below.

BRIEF SUMMARY

It is an object of the invention to provide a method for reducing distortions originating from a balanced link between a transmitter connected to a first ground and a receiver connected to a second ground.

In accordance with an embodiment there is provided a method for reducing distortions originating from a balanced link between a transmitter connected to a first ground and a receiver connected to a second ground, the method comprising isolating a connection to one of the first ground and the second ground and connecting the isolated connection to the other ground via a dedicated link.

In accordance with an embodiment the receiver is an audio/video receiver, the transmitter is an audio/video transmitter and the balanced link is used to transmit an audio/video signal.

In yet another embodiment the balanced link comprises a plurality of wires, each of the plurality of wires being used for transmitting a corresponding audio/video component signal, the connecting of the isolated connection to the other ground via a dedicated link comprises selecting a given wire from the plurality of wires, the given wire being used for transmitting a given audio/video component signal, injecting the given audio/video component signal into another wire from the plurality wires and using the selected given wire to connect the isolated connection to the other ground.

In accordance with another embodiment the given wire selected is one of two wires used for transmitting a first audio component signal.

In yet accordance with another embodiment, the other wire is one of two wires used for transmitting a second audio component signal and the injecting is performed in one of the two wires used for transmitting the second audio component signal.

In accordance with another embodiment there is provided a passive adapter for reducing distortions originating from a balanced link between an audio/video transmitter connected to a first ground and an audio/video receiver connected to a second ground, the passive adapter comprising a first unbalanced video terminal; a second unbalanced video terminal; a third unbalanced video terminal; a first unbalanced audio terminal; a second unbalanced audio terminal; a first balanced choke having a first end and a second end; a first balun transformer having a first input operatively connected to the first unbalanced video terminal, a first output operatively connected to the first end of the first balanced choke and a second output operatively connected to the second end of the first balanced choke; a second balanced choke having a first end and a second end; a second balun transformer having a first input connected to the second unbalanced video terminal, a first output operatively connected to the first end of the second balanced choke and a second output operatively connected to the second end of the second balanced choke; a third balun transformer having a first input operatively connected to the third unbalanced video terminal, a first output operatively connected to the first balanced choke at a given location and a second output operatively connected to the second choke at a given location; a first audio transformer having a first input operatively connected to the first unbalanced audio terminal, a first output and a second output; a second audio transformer having a first input operatively connected to the first unbalanced audio terminal, a first output and a second output, said second output of said second audio transformer being operatively connected to said second output of said first audio transformer and a plurality of connecting ends for connecting the passive adapter to the balanced link, each of the plurality of connecting ends being connected to the first output of the first balun transformer, the second output of the first balun transformer, the first output of the second balun transformer, the second output of the second balun transformer, the first output of the third balun transformer, the second output of the third balun transformer, the first output of the first audio transformer, the second output of the first audio transformer, the first output of the second audio transformer and a ground signal level.

In accordance with another embodiment the first unbalanced video terminal receives a first video component signal from the audio/video transmitter; the second unbalanced video terminal receives a second video component signal from the audio/video transmitter; the third unbalanced video terminal receives a third video component signal from the audio/video transmitter; the first unbalanced audio terminal receives a first audio component signal from the audio/video transmitter and the second unbalanced audio terminal receives a second audio component signal from the audio/video transmitter.

In yet another embodiment, the first video component signal is used to carry color red code, the second video component signal is used to carry color green code and the third video component signal is used to carry color blue code, the first audio component signal is used to carry left audio channel code and the right audio component signal is used to carry right audio channel code.

In yet another embodiment, each of the first unbalanced video terminal, the second unbalanced video terminal, the third unbalanced video terminal, the first unbalanced audio terminal and the second unbalanced audio terminal comprises an RCA or alike used in art connector.

In another embodiment, the plurality of connecting ends comprises an RJ 45 or alike used in art jack for connecting the passive adapter to the balanced link.

In accordance with another embodiment, the first unbalanced video terminal provides a first video component signal to the audio/video receiver; the second unbalanced video terminal provides a second video component signal to the audio/video receiver; the third unbalanced video terminal provides a third video component signal to the audio/video receiver; the first unbalanced audio terminal provides a first audio component signal to the audio/video receiver and the second unbalanced audio terminal provides a second audio component signal to the audio/video receiver.

In yet another embodiment, each of the first balun transformer, the second balun transformer and the third balun transformer has an inductance of 20 mH. In accordance with an embodiment there are 3 independent in amplitude domain but synchronized in phase domain signals, known in art as YPbPr. Signal Y bandwidth contains significant value in amplitude domain of low frequency components 60 Hz or less, while Pb and Pr not.

In accordance with another embodiment, each of the first balanced choke and the second balanced choke has an inductance of 20 mH or more.

In yet another embodiment, the first output of the third balun transformer is connected at the middle of the first balanced choke; the second output of the third balun transformer is connected at the middle of the second balanced choke.

In accordance with another embodiment, there is provided a system for reducing distortions between an audio/video transmitter and an audio/video receiver, the system comprising a first passive adapter, the first passive adapter being operatively connected to the audio/video transmitter; a second passive adapter, the second passive adapter being operatively connected to the audio/video receiver and a balanced link to be connected to the first passive adapter and to the second passive adapter.

In accordance with another embodiment, the balanced link comprises a plurality of wires.

In yet another embodiment, the plurality of wires is provided in an Unshielded Twisted Pair (UTP) cable.

In accordance with another embodiment, there is provided a passive adapter for reducing distortions originating from a balanced link between an audio/video transmitter connected to a first ground and an audio/video receiver connected to a second ground, the passive adapter comprising a first unbalanced video terminal; a second unbalanced video terminal; a third unbalanced video terminal; a first unbalanced audio terminal; a second unbalanced audio terminal; a first balanced choke having a first end and a second end; a first balun transformer having a first input operatively connected to the first unbalanced video terminal, a first output and a second output; an inductor having a first end and a second end, said second end being operatively connected to a ground; a second balun transformer having a first input connected to the second unbalanced video terminal, a first output operatively connected to the first end of the first balanced choke and a second output operatively connected to the second end of the first balanced choke and to the first end of the inductor; a third balun transformer having a first input operatively connected to the third unbalanced video terminal, a first output operatively connected to the first balanced choke at a given location and a second output; a first audio transformer having a first input operatively connected to the first unbalanced audio terminal, a first output and a second output; a second audio transformer having a first input operatively connected to the first unbalanced audio terminal, a first output and a second output, said second output of said second audio transformer being operatively connected to said second output of said first audio transformer and a plurality of connecting ends for connecting said passive adapter to said balanced link, each of the plurality of connecting ends being connected to the first output of the first balun transformer, the second output of the first balun transformer, the first output of the second balun transformer, the second output of the second balun transformer, the first output of the third balun transformer, the second output of the third balun transformer, the first output of the first audio transformer, the second output of the first audio transformer, the first output of the second audio transformer and said ground.

BRIEF DESCRIPTION OF THE DRAWINGS

In order that the invention may be readily understood, embodiments of the invention are illustrated by way of example in the accompanying drawings.

Further details of the invention and its advantages will be apparent from the detailed description included below.

DETAILED DESCRIPTION

In the following description of the embodiments, references to the accompanying drawings are by way of illustration of an example by which the invention may be practiced. It will be understood that other embodiments may be made without departing from the scope of the invention disclosed.

Figure 1:
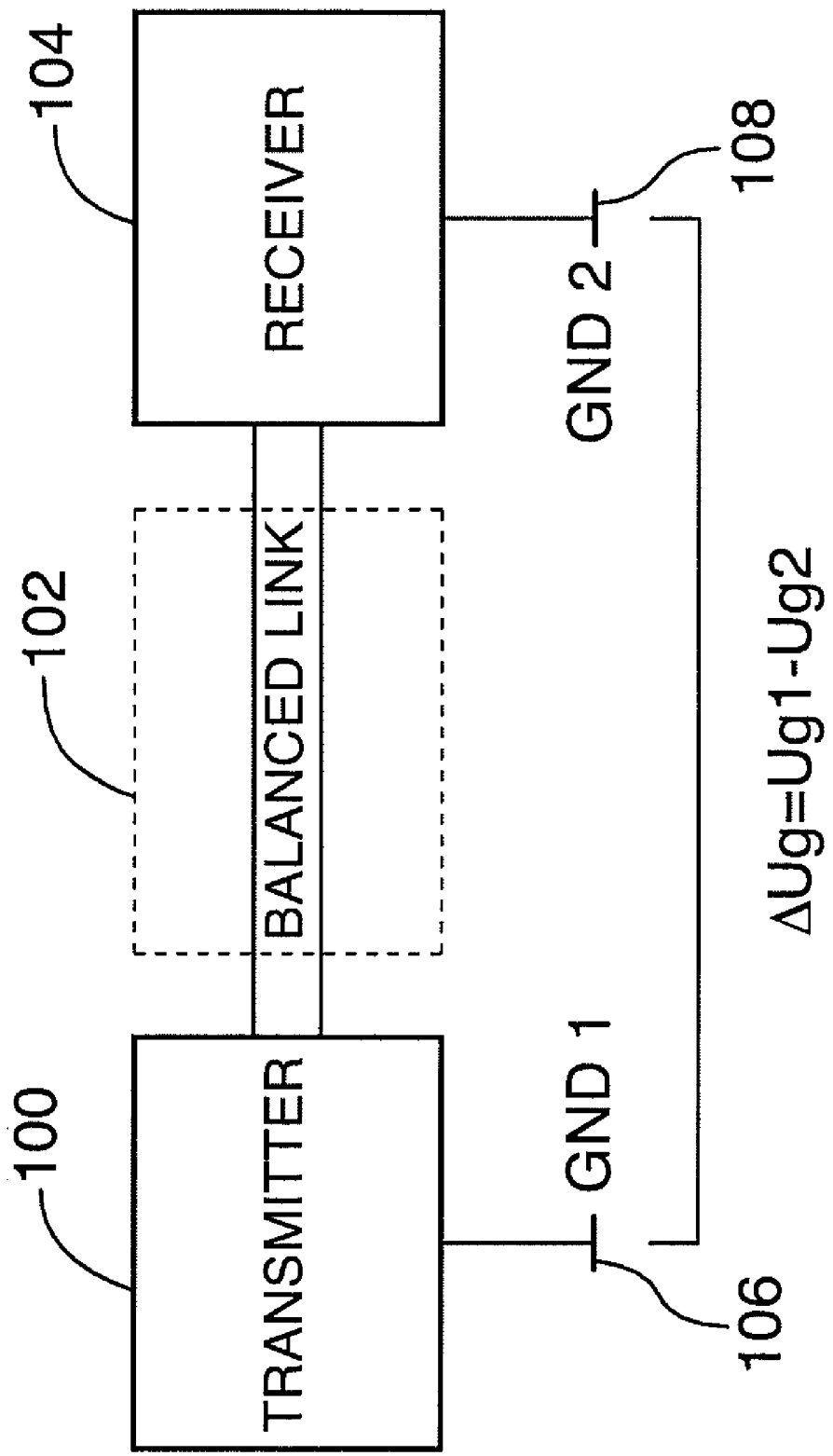
FIG. 1 is a schematic which shows a prior art embodiment for connecting a transmitter to a receiver.
Figure 2:
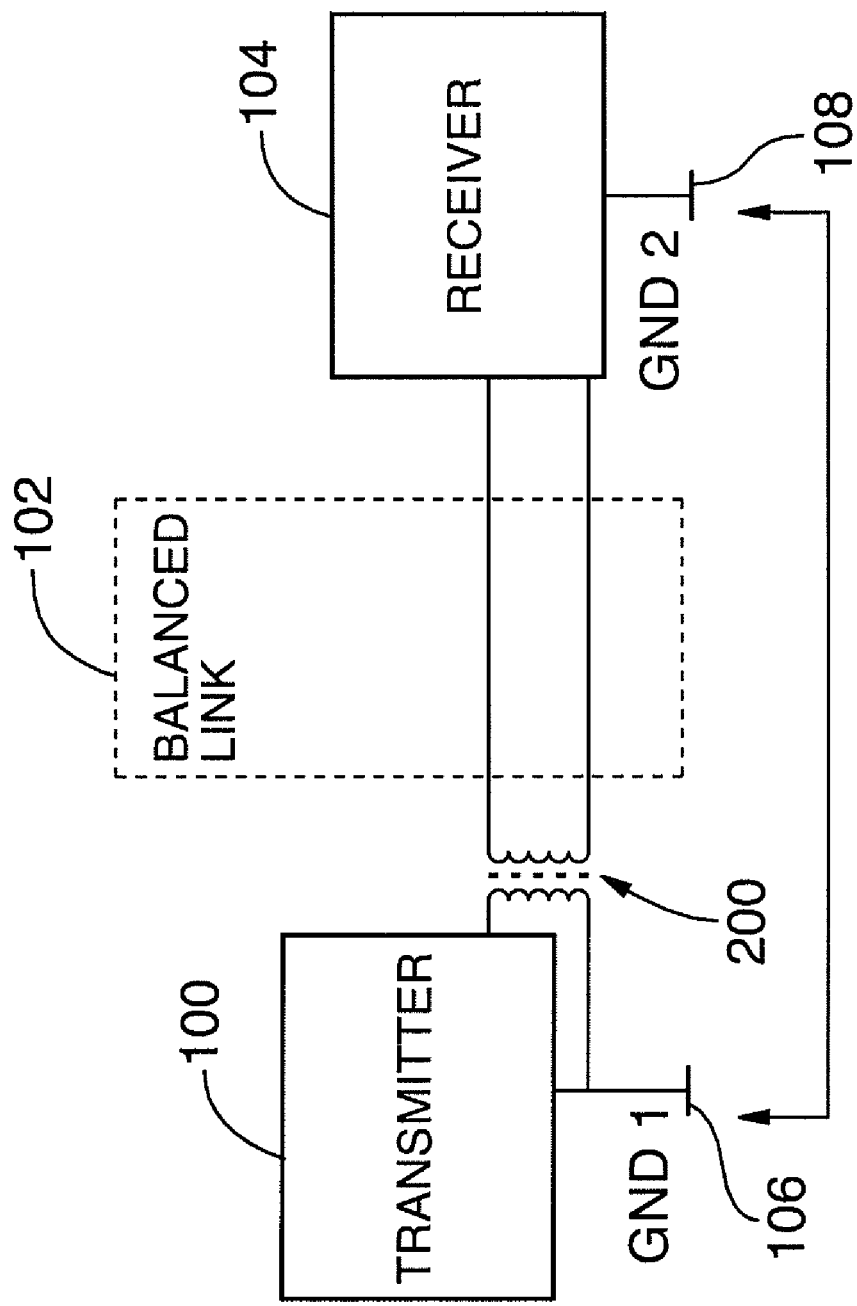
FIG. 2 is a schematic which shows another prior art embodiment for connecting a transmitter to a receiver wherein a "Ground Loop Isolation" (GLI) technique is used for reducing the distortions created by the balanced link.
Figure 3:
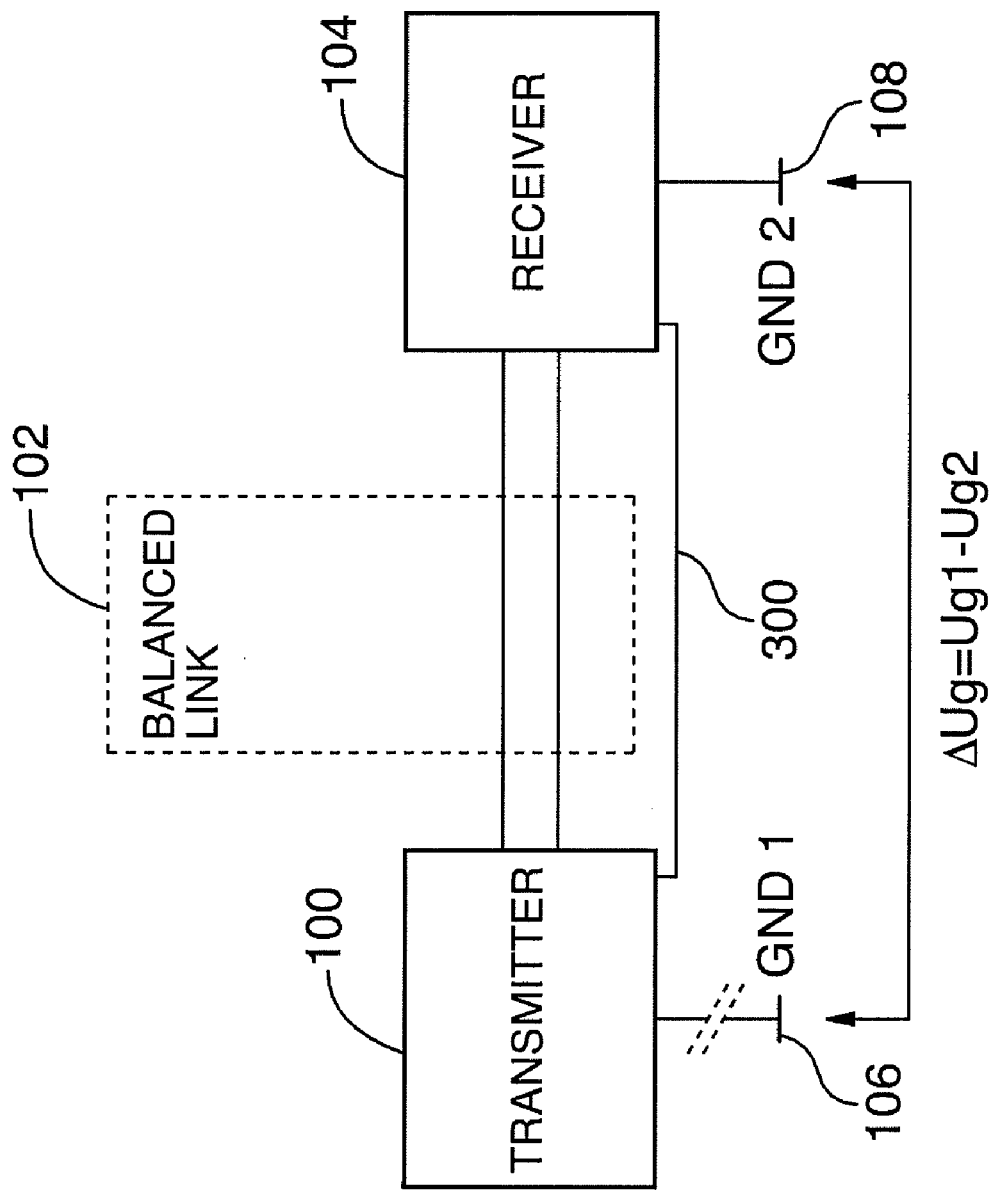
FIG. 3 is a schematic which shows an embodiment for connecting a transmitter to a receiver using a balanced link.

Now referring to FIG. 3, there is shown one embodiment of a system for connecting a transmitter 100 to a receiver 104.

It will be appreciated that the system disclosed in FIG. 3 is of great advantage for an organization or an individual willing to extend a distance between the transmitter 100 and the receiver 104 since it enables the removal of ground loop distortions as further explained below. At home or at the office, widely achievable distances suggested by manufacturers range up to few tens of feet maximum which can be a serious limitation.

It will be appreciated that the transmitter 100 may be, in one embodiment, any type of audio/video transmitter providing an audio/video signal and is selected from a group consisting of DVD players, VCRs, satellite receivers or any other devices adapted for converting images and sounds into electrical signals.

It will be further appreciated that the receiver 104 may be, in one embodiment, any type of audio/video receiver adapted for converting electrical signals into images and sound.

In one embodiment, the receiver 104 comprises a TV monitor. The skilled addressee will appreciate that the transmitter 100 and the receiver 104 may operate according to various standards, known to the skilled addressee.

Still referring to FIG. 3, it will be appreciated that the connection between the transmitter 100 and the receiver 104 is achieved using the balanced link 102 comprising a plurality of isolated copper wires gage 24 combined in pairs. The skilled addressee will appreciate that the wires in each pair are twisted and color coded.

The skilled addressee will appreciate that in this embodiment the transmitter 100 is isolated from the ground 106. Moreover, the isolated connection is connected to the ground 108 using a dedicated link 300.

The skilled addressee will appreciate that this is of great advantage for reducing distortions.

Figure 4A:
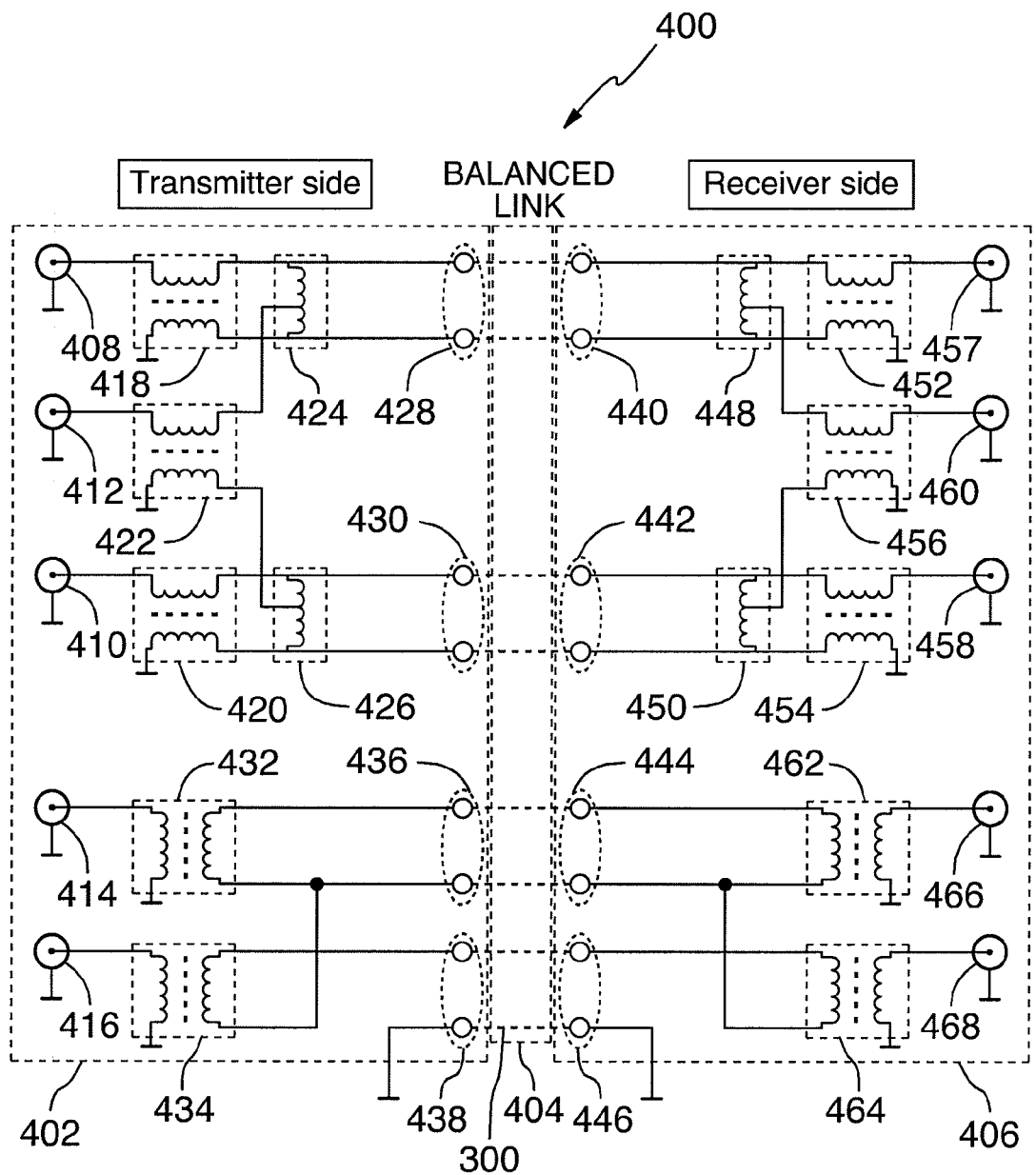
FIG. 4a is a schematic which shows an embodiment of a system for connecting an audio/video source (transmitter) to an audio/video receiver, wherein a balanced link, a passive transmitter adapter and a passive receiver adapter are used.

Now referring to FIG. 4a, there is shown an embodiment of a system 400 for connecting the transmitter 100, not shown in FIG. 4a, to the receiver 104, not shown in FIG. 4a, according to what has been disclosed in FIG. 3.

It will be appreciated that the system 400 disclosed comprises a passive transmitter adapter 402, a balanced link 404 and a passive receiver adapter 406.

The passive transmitter adapter 402 comprises a first video signal terminal 408, a second video signal terminal 410 and a third video signal terminal 412. It will be appreciated that each of the first video signal terminal 408, the second video signal terminal 410 and the third video signal terminal 412 is used to receive a component of the video signal. It will be appreciated that in one embodiment the video signal comprises three independent video signals. A first video signal is carrying color red code while a second video signal is carrying color blue code and a third vide signal is carrying color green code. In one embodiment, the first video signal terminal 408 and the second video signal terminal 410 are used to carry video signals depleted of low frequency signals and usually refer to color components. It will be further appreciated that the third video signal terminal 412 is used to carry full video signal including synchronization and color components. Moreover it will be appreciated that the resolution of the signal may be 480i/p, 720p, 1080i/p. Moreover, it will be appreciated that each of the first video signal terminal 408, the second video signal terminal 410 and the third video signal terminal 412 is an unbalanced terminal of a RCA type.

In one embodiment the unbalanced terminals are used for connecting to the transmitter 100.

Similarly, the passive transmitter adapter 402 comprises a first audio signal terminal 414 and a second audio signal terminal 416. It will be appreciated that each of the first audio signal terminal 414 and the second audio signal terminal 416 is used to receive a component of the audio signal. It will be appreciated that in one embodiment the audio signal is provided according to Hi-Fi stereo audio standard in which a first signal is carrying left audio channel code while a second signal is carrying right audio channel code. Moreover, it will be appreciated that each of the first audio signal terminal 414 and the second audio signal terminal 416 is an unbalanced terminal of a RCA type.

In one embodiment the unbalanced terminals 414 and 416 are used each for connecting a coaxial cable originating from the transmitter 100.

Still referring to FIG. 4a, the passive transmitter adapter 402 further comprises a first balun transformer 418, a second balun transformer 420 and a third balun transformer 422. It will be appreciated that the first balun transformer 418, the second balun transformer 420 and the third balun transformer 422 are used for converting a given unbalanced signal into a given balanced signal. In one embodiment, the first balun transformer 418, the second balun transformer 420 and the third balun transformer 422 have an inductance of 20 mH.

It will be appreciated that a first input of the first balun transformer 418 is connected to the first video signal terminal 408 while a first input of the second balun transformer 420 is connected to the second video signal terminal 410 and a first input of the third balun transformer 422 is connected to the third video signal terminal 412.

Still referring to FIG. 4a, the passive transmitter adapter 402 further comprises a first balanced choke 424 and a second balanced choke 426. It will be appreciated that each of the first balanced choke 424 and the second balanced choke 426 is used for coding the three unbalanced video channels the way to be transmitted via two balanced video channels. In one embodiment, each of the first balanced choke 424 and the second balanced choke 426 has an inductance of 100 mH.

It will be appreciated that the each of the two outputs of the first balun transformer 418 is connected to a respective end of the first balanced choke 424, while each of the two outputs of the second balun transformer 420 is connected to a respective end of the second balanced choke 426.

It will be further appreciated that each of the two outputs of the third balun transformer 422 is connected at a given position on a respective one of the first balanced choke 424 and the second balanced choke 426. In a preferred embodiment, the given position is the middle of the second balanced choke 426.

The passive transmitter adapter 402 further comprises a first pair of connecting ends 428 and a second pair of connecting ends 430. The skilled addressee will appreciate that the first pair of connecting ends 428 is coupled to each end of first balanced choke 424 while the second pair of connecting ends 430 is coupled to each end of the second balanced choke 426. The first pair of connecting ends 428 and the second pair of connecting ends 430 are used for transmitting the video signal over the balanced link 404 to the passive receiver adapter 406 which will be further described below.

The passive transmitter adapter 402 further comprises a first audio transformer 432 and a second audio transformer 434. It will be appreciated that the first audio transformer 432 and the second audio transformer 434 are used for converting an unbalanced signal into a balanced signal. In one embodiment, the first audio transformer 432 and the second audio transformer 434 have each an inductance of 25H.

It will be appreciated that a first input of the first audio transformer 432 is connected to the first audio signal terminal 414 while a first input of the second audio transformer 434 is connected to the second audio signal terminal 416.

Moreover, it will be appreciated that the passive transmitter adapter 402 comprises a third pair of connecting ends 436 and a fourth pair of connecting ends 438.

The third pair of connecting ends 436 and the fourth pair of connecting ends 438 are used for transmitting the audio signal and the ground signal over the balanced link 400 to the passive receiver adapter 406 which will be further described below.

The third pair of connecting ends 436 is coupled to the output of the first audio transformer 432. A first output of the second audio transformer 434 is connected to a first output of the second audio transformer 432 while a second output of the second audio transformer 434 is connected to one of the fourth pair of connecting ends 438. The other connecting end of the fourth pair of connecting ends 438 is connected to the ground of the transmitter, not shown.

The skilled addressee will therefore appreciate that one end of the fourth pair of connecting ends 438 is used for transmitting a transmitter ground signal over the balanced link 404.

It will be further appreciated that in one embodiment, the balanced link 404 is implemented using Unshielded Twisted Pair (UTP) cable category 5. It will be appreciated that such cable is often built-in in home or office structures. The skilled addressee will appreciate that the Unshielded Twisted Pair (UTP) cable may be defined by terms such a number of twisted pairs. Usually the cable comprises four pairs and is available in the office or home through wall mounted ready to use jacks, also known as RJ 45 jacks.

The skilled addressee will appreciate that the system 400 disclosed in FIG. 4a further comprises the passive receiver adapter 406.

It will be appreciated that the passive receiver adapter 406 is used for connecting the receiver, not shown, to the balanced link 404.

More precisely, the passive receiver adapter 406 comprises a first pair of connecting ends 440, a second pair of connecting ends 442, a third pair of connecting ends 444 and a fourth pair of connecting ends 446.

It will be appreciated that the first pair of connecting ends 440 of the passive receiver adapter 406 is operatively connected to the first pair of connecting ends 428 of the passive transmitter adapter 402 while the second pair of connecting ends 442 of the passive receiver adapter 406 is operatively connected to the second pair of connecting ends 430 of the passive transmitter adapter 402 while the third pair of connecting ends 444 of the passive receiving adapter 406 is operatively connected to the third pair of connecting ends 436 of the passive transmitter adapter 402 and while the fourth pair of connecting ends 446 of the passive receiver adapter 406 is operatively connected to the fourth pair of connecting ends 438 of the passive transmitter adapter 402 straight-through way so the wires are not reverse positioned.

The passive receiver adapter 406 further comprises a first balanced choke 448 and a second balanced choke 450. It will be appreciated that each of the first balanced choke 448 and the second balanced choke 450 is used for decoding signals originating from two balanced video channels the way to receive three unbalanced video channels. In one embodiment, each of the first balanced choke 448 and the second balanced choke 450 has an inductance of 100 mH or more.

Still in the embodiment disclosed, each connecting end of the first pair of connecting ends 440 is connected to a respective end of the first balanced choke 448 while each connecting end of the second pair of connecting ends 442 is connected to a respective end of the second balanced choke 450.

The passive receiver adapter 406 further comprises a first balun transformer 452, a second balun transformer 454 and a third balun transformer 456. It will be appreciated that each of the first balun transformer 452, the second balun transformer 454 and the third balun transformer 456 is used for converting a balanced signal into an unbalanced signal. Still in one embodiment the first balun transformer 452, the second balun transformer 454 and the third balun transformer 456 have each an inductance of 20 mH.

Still in the embodiment disclosed, the first balun transformer 452 is connected to each end of the first balanced choke 448 while the second balun transformer 454 is connected to each end of the second balanced choke 450.

It will be appreciated that each input of the third balun transformer 456 is connected at a given corresponding position on the first balanced choke 448 and on the second balanced choke 450. It will be appreciated that in a preferred embodiment, the given corresponding position is the middle of the balanced choke.

The passive receiver adapter 406 further comprises a first video signal terminal 457, a second video signal terminal 458 and a third video signal terminal 460. It will be appreciated that each of the first video signal terminal 457, the second video signal terminal 458 and the third video signal terminal 460 is used to provide a component of the video signal to the receiver, not shown. Moreover, it will be appreciated that each of the first video signal terminal 457, the second video signal terminal 458 and the third video signal terminal 460 is an unbalanced terminal of a RCA type.

It will be appreciated that the first video signal terminal 456 is connected to a first output of the first balun transformer 452, while the second video signal terminal 458 is connected to a first output of the second balun transformer 454 and the third video signal terminal 460 is connected to a third balun transformer 456.

It will be appreciated that the signal located at the first video terminal 457 is transparent for the incoming video signal since the incoming video signal is converted from an unbalanced signal to a balanced signal by the passive transmitter adapter 402 and further converted from a balanced signal to an unbalanced signal by the passive receiver adapter 406.

It will be appreciated that the signal derived from the third video signal terminal 412, carrying the same phase as an incident video signal is not present at the first video signal terminal 457 because the signal appears in an unbalanced mode at the first balun transformer 452 of the passive receiver adapter 406 so it is attenuated by the Common Mode Rejection Ratio (CMRR) of the first balun transformer 452 of the passive receiver adapter 406.

It will be further appreciated that the signal derived from the third video signal terminal 412, carrying reverse phase as an incident video signal is not present on the second video signal terminal 458 because the signal appears in an unbalanced mode at the second balun transformer 454 of the passive receiver adapter 406 so it is attenuated by the Common Mode Rejection Ratio of the second balun transformer 454 of the passive receiver adapter 406.

It will be appreciated that the signal at the first video signal terminal 457 is not present at the third video signal terminal 460 because its value tends to be so small that it can be disregarded.

It will be further appreciated that the signal present at the second video signal terminal 458 is not present at the third video signal terminal 460 because its value tends to be so small that it can be disregarded for the same reasons like above.

The signals located at the first video signal terminal 457 and at the second video signal terminal 458 are isolated, because the only connection between them is the third balun transformer 456, but the voltage difference on its balanced terminals tends to be so small that it can be disregarded.

The passive receiver adapter 406 further comprises a first audio transformer 462 and a second audio transformer 464. It will be appreciated that the first audio transformer 462 and the second audio transformer 464 are used for converting a balanced signal into an unbalanced signal. In one embodiment, the first audio transformer 462 and the second audio transformer 464 have an inductance of 25H.

It will be appreciated that each input of the first audio transformer 462 is connected to a corresponding end of the third pair of connecting ends 444. With respect to the fourth pair of connecting ends 446, a first end of the fourth pair of connecting ends 446 is connected to an input of the second audio transformer 464 while the second end of the fourth pair of connecting ends 446 is connected to the ground of the receiver, not shown. It will be appreciated that the second input of the second audio transformer 464 is connected to the second input of the first audio transformer 462.

It will be appreciated that a first output of the first audio transformer 462 is connected to a first audio signal terminal 466 while a first output of the second audio transformer 464 is connected to the second audio signal terminal 468. It will be appreciated that each of the first audio signal terminal 466 and the second audio signal terminal 468 is an unbalanced terminal of a RCA type.

It will be appreciated that one advantage of the embodiment disclosed is the providing of stereo audio transmission concept using 1½ twisted pairs of the UTP cable to transmit two independent audio channels.

Figure 4B:
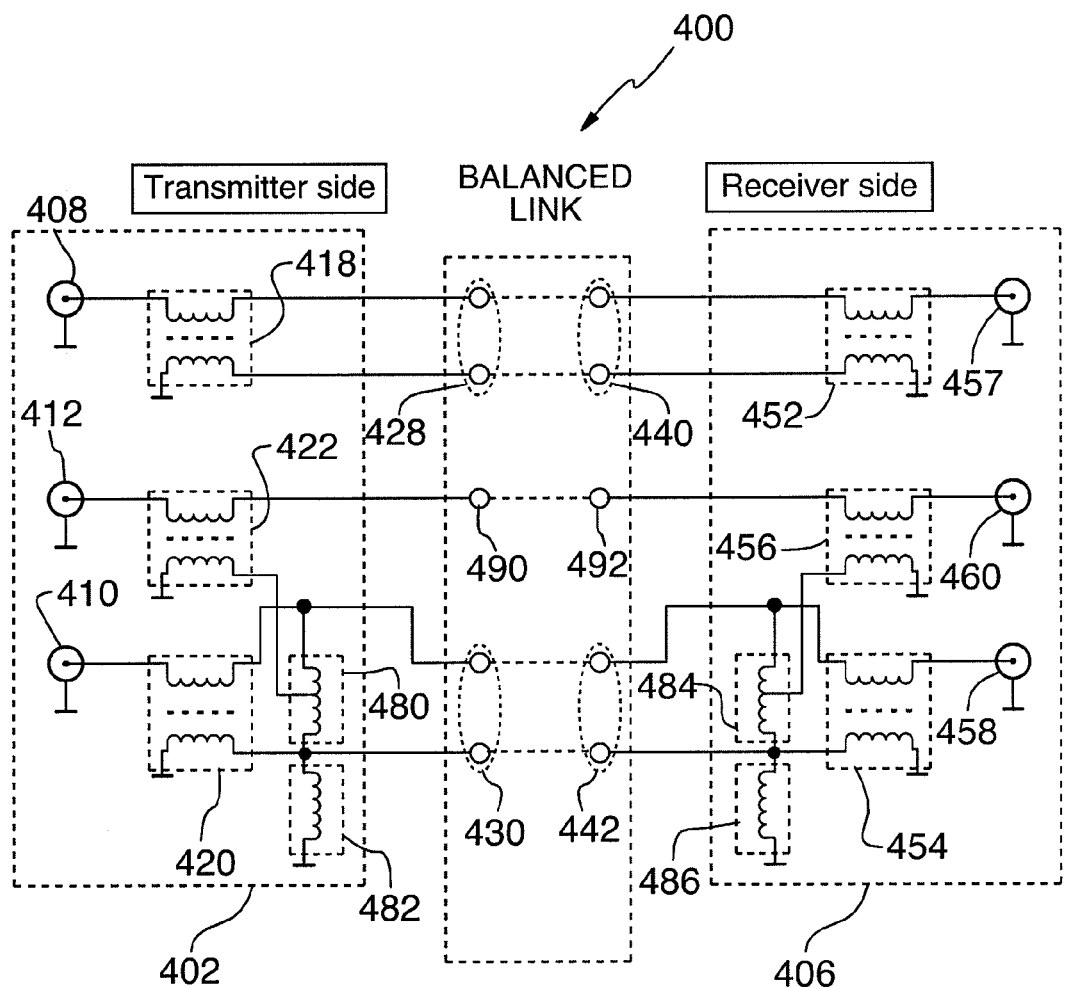
FIG. 4b is a schematic which shows an embodiment of one part of a system for connecting an audio/video source (transmitter) to an audio/video receiver, wherein two and half twisted pair of cables are used to transmit three video signals.

Now referring to FIG. 4b, there is shown another embodiment of one part of the system 400 for connecting the transmitter 100, not shown in FIG. 4a, to the receiver 104, not shown in FIG. 4a, according to what has been disclosed in FIG. 3.

It will be appreciated that in this embodiment two and half twisted pairs of cable are used in order to transmit three independent video channels.

More precisely and in this embodiment, the passive transmitter adapter 402 further comprises a first balun transformer 418, a second balun transformer 420 and a third balun transformer 422. It will be appreciated that the first balun transformer 418, the second balun transformer 420 and the third balun transformer 422 are used for converting a given unbalanced signal into a given balanced signal. In one embodiment, the first balun transformer 418, the second balun transformer 420 and the third balun transformer 422 have an inductance of 20 mH.

It will be appreciated that a first input of the first balun transformer 418 is connected to the first video signal terminal 408 while a first input of the second balun transformer 420 is connected to the second video signal terminal 410 and a first input of the third balun transformer 422 is connected to the third video signal terminal 412.

The passive transmitter adapter 402 further comprises a first balanced choke 480 and an inductor 482.

In one embodiment, the first balanced choke 480 has an inductance of 100 mH. Still in one embodiment, the inductor 482 has an inductance of 200 uH. The skilled addressee will appreciate that the inductor 482 acts as a short circuit for low frequency signals ranging from 50-100 Hz and as an open circuit for high frequency signals appearing on the second video signal terminal 410.

In fact, it will be appreciated that in this embodiment, the first video signal terminal 408 is used to carry full video signal including synchronization and color components while the second video signal terminal 410 and the third video signal terminal 412 are used to carry video signals depleted of low frequency signals and usually refer to color components.

Still referring to FIG. 4b, it will be appreciated that a first input of the first balun transformer 418 is connected to the first video signal terminal 408 while a first input of the second balun transformer 420 is connected to the second video signal terminal 410 and a first input of the third balun transformer 422 is connected to the third video signal terminal 412.

It will be appreciated that each of the two outputs of the first balun transformer 418 is coupled to one of the first pair of connecting ends 428.

It will be further appreciated that one of the two outputs of the third balun transformer 422 is connected to connecting end 490 being part of balanced link 400 comprising mirroring end 492. The other one of the two outputs of the third balun transformer 422 is connected at a given position on the first balanced choke 480. In a preferred embodiment, the given position is the middle of the first balanced choke 480.

It will be appreciated that the first balanced choke 480 is coupled to each of the two outputs of the second balun transformer 420. Moreover, each of the two outputs of the second balun transformer 420 is coupled to one of the second pair of connecting ends 430. The inductor 482 is coupled to one of the two outputs of the second balun transformer 420.

It will be appreciated by the skilled addressee that the passive receiver adapter 406 has a configuration mirroring the configuration of the passive transmitter adapter 402 thereby comprising 452, 457, 456, 460, 484, 458, 486, 454.

The skilled addressee will appreciate that in this embodiment two and half twisted pairs of cable are used in order to transmit the three independent video channels. In one embodiment, the cable is UTP cat 5 cable.

Figure 5:
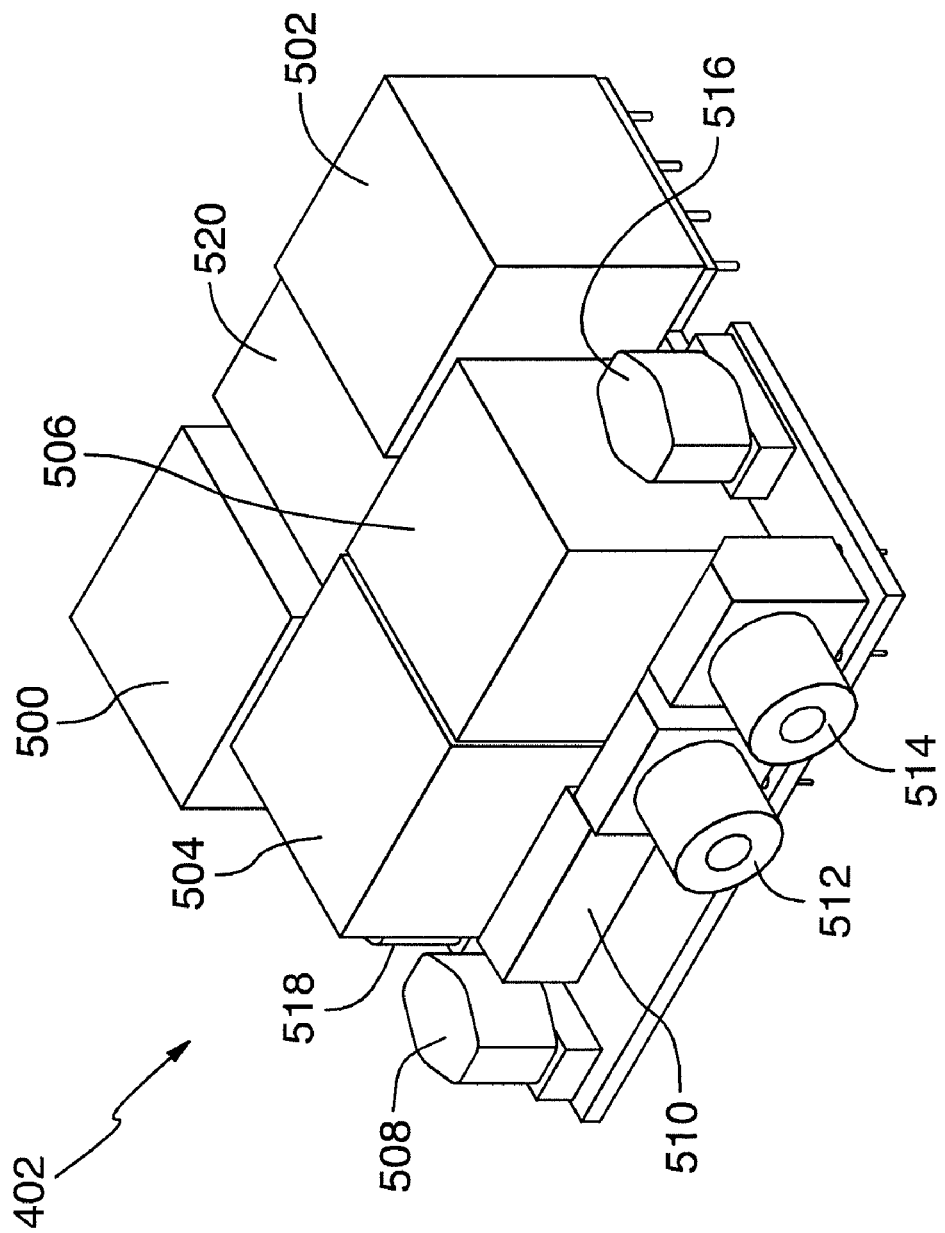
FIG. 5 is a 3D perspective view of an embodiment of the passive transmitter adapter used for connecting an audio/video source to an audio/video receiver using the balanced link.

Now referring to FIG. 5, there is shown one embodiment of the passive transmitter adapter 402. It will be appreciated by the skilled addressee that the passive receiver adapter 406 is similar to the passive transmitter adapter 402.

Still in this embodiment, the passive transmitter adapter 402 disclosed comprises a first audio transformer 500, a second audio transformer 502, a first balanced choke 504, a second choke 506, a first balun transformer 508, a BNC cable header 510, BNC audio jacks 512 and 514, a second balun transformer 516, a third balun transformer 518 and a RJ45 jack 520. In one embodiment, the passive transformer adapter 402 is built on a 2"×2" PCB and has a height of 1". The skilled addressee will appreciate that the passive receiver adapter 406 as well as the passive transmitter adapter 402, are very compact which is also of great advantage.

In one embodiment, each of the balun transformers 418, 420, 422, 452, 454, 456 has a bandwidth of 60 MHz. Still in this embodiment, each balun transformer has a ferrite core made using a stack of two 28-3583-F39 toroidal cores manufactured by MMG Neosid, each stacked on top of another one. The windings are defined as follows.

| Coil # | | #Turns | Wire size | Winding style | Start | End | Resistance |
|---|---|---|---|---|---|---|---|
| 1 | L1 = 20 mH Typ. | 46 | 39 AWG, red | twisted pair L1 & L2 | 0° | 360° | 2.2 ohm |
| 2 | L2 = 20 mH Typ. | 46 | 39 AWG, green | twisted pair L1 & L2 | 0° | 360° | 2.2 ohm |

Figure 6:
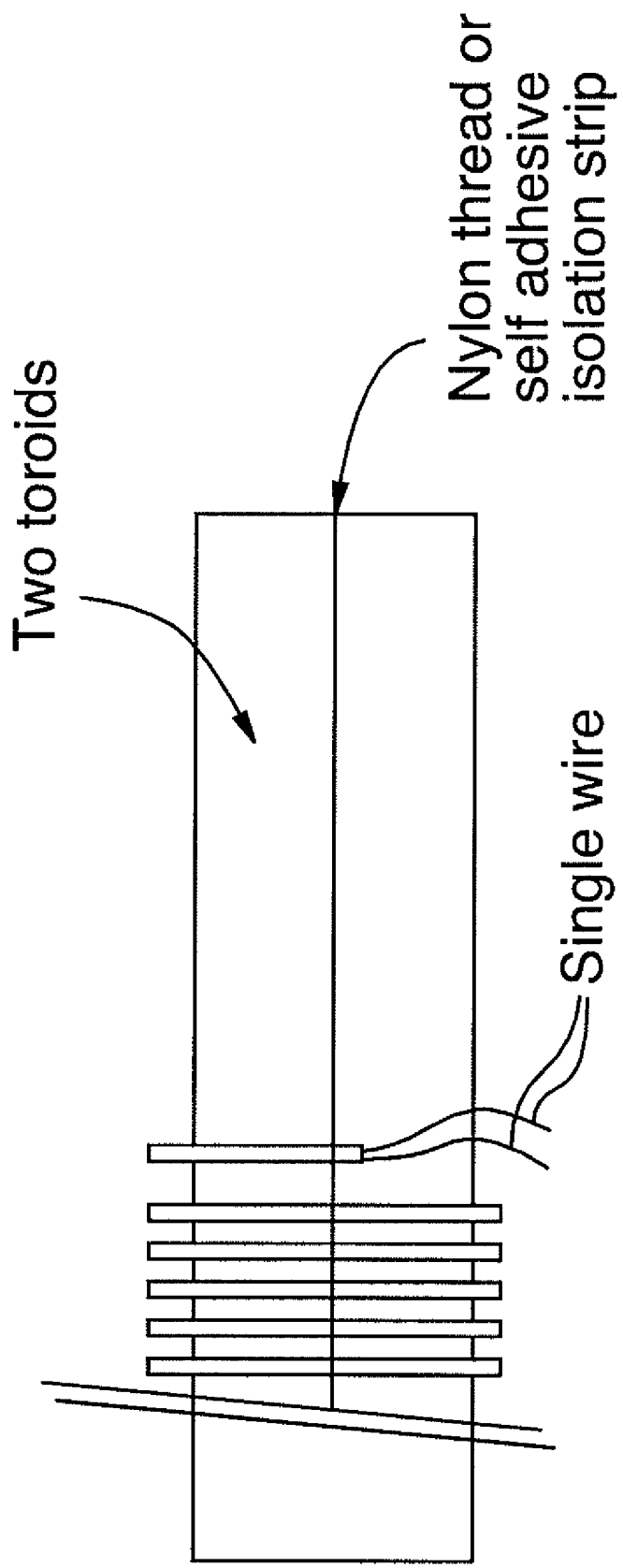
FIG. 6 is a schematic which shows one embodiment of the windings of a balun transformer of the passive transmitter adapter.

Now referring to FIG. 6, there is shown an embodiment of the windings of the balun transformer.

It will be appreciated that in this embodiment each balun transformer is a wire enameled transformer type. Two wires are twisted 10-12 turns per inch length in this embodiment. Still in this embodiment, the windings are secured to prevent an accidental unwinding as shown in FIG. 6. Each turn of wire of L1/2 does not overlap the next turn in this embodiment. The windings are laid along the radius of the ferrite core.

It will be further appreciated that the tolerance is ±10%, if not indicated otherwise. Maximum voltage between windings is 1V while maximum current is 1 mA. It will be appreciated that all materials withstand a temperature of 260° C. of multiple cycle thermal process in one embodiment. The balun transformer is further compliant with RoHS as well as UL94V0 flammability rating.

It will be appreciated that in one embodiment no glue or epoxy is applied on the windings. Tie-wraps, shrink tube, self adhesive tape may be used for securing the windings.

It will be further appreciated that nylon thread or other methods may be used to mechanically secure the windings.

It will be appreciated that in one embodiment, PI-1018-6 from Plasmetex Industries Inc is used for the header mounting of the balun transformer.

Figure 7:
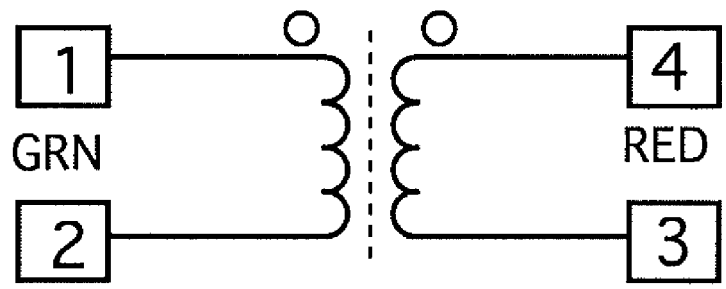
FIG. 7 is a schematic which shows how the inductor of the balun transformer is oriented in reference to the header.
Figure 7:
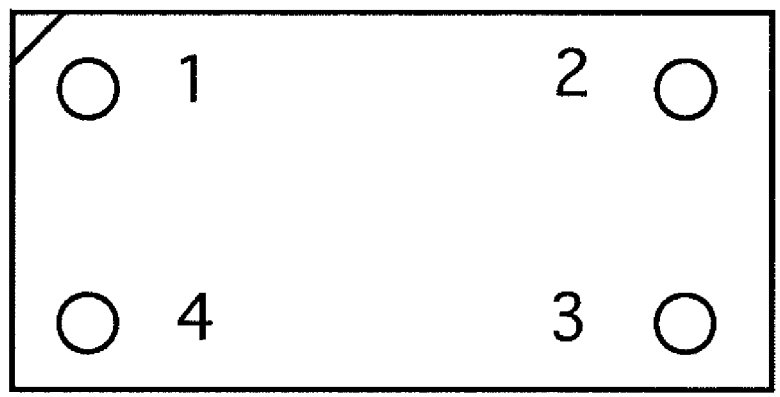

Now referring to FIG. 7, there is shown how the inductor is oriented in reference to the header of the balun transformer.

Figure 8A:
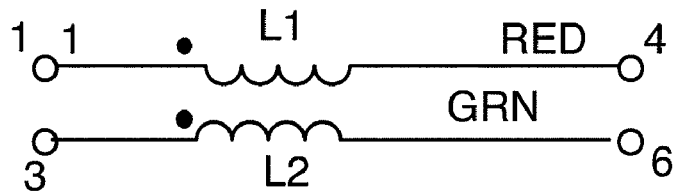
FIG. 8a shows a schematic diagram of an embodiment of the balanced choke.

Now referring to FIG. 8a, there is shown an embodiment of a schematic diagram of one of the balanced chokes 424, 426, 448 and 450. It will be appreciated that in this embodiment terminals 3 and 4 are coupled together so the balanced choke has a center tap 3-4.

The windings of each of the balanced choke 424, 426, 448 and 450 are defined as follows.

| | Coil # | #Turns | Wire size | Winding style | Start | End | Wire length |
|---|---|---|---|---|---|---|---|
| 1 | L1 | 54 | 36 AWG, red | twisted pair L1 & L2 | 0° | 340° | 30" |
| 2 | L2 | 54 | 36 AWG, green | twisted pair L1 & L2 | 0° | 360° | 30" |

Each of the balanced choke is a wire enameled transformer type. Moreover, the two wires are twisted 10-12 turns per inch length.

In this embodiment, the colors of twisted wires are distinguishable. Moreover and in one embodiment, the windings are secured in order to prevent an accidental unwinding.

In one embodiment, the turns of L1/2 are situated next to each other but are never overlapping and lay along the radius.

In one embodiment, header HTM461-6, manufactured by Lodestone Pacific, is used. The transformer is mounted onto the header using a heat shrink. In one embodiment, the heat shrink length of approximately 0.5" overlaps the ferrite core and the header. It will be appreciated that no varnish or resin is used for winding impregnation. Angular tolerances are plus or minus 5 percents, if not indicated otherwise. Other tolerances are plus or minus 10 percents, if not indicated otherwise.

Figure 8B:
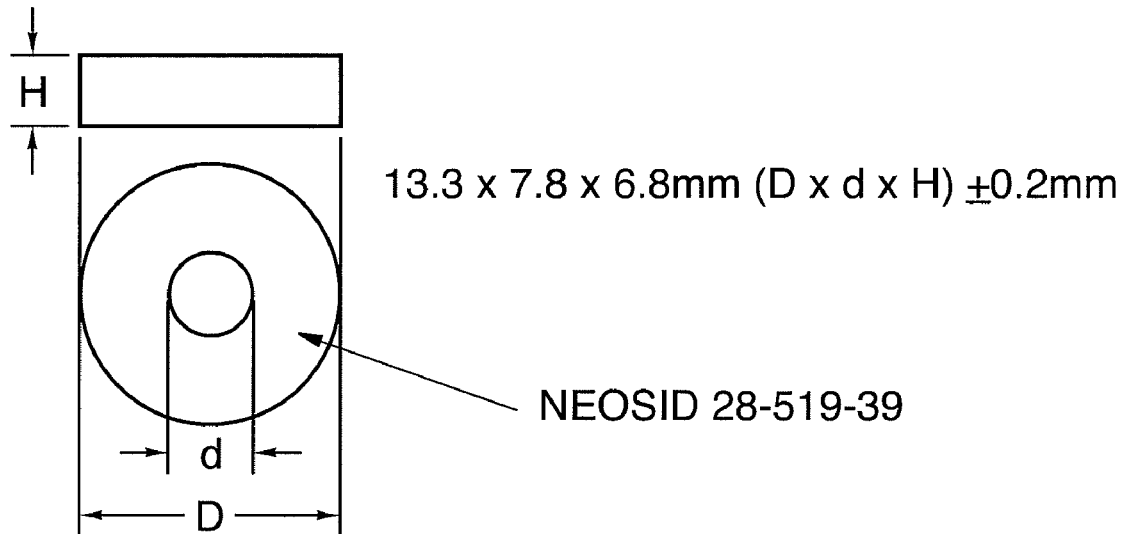
FIG. 8b is a schematic which shows an embodiment of the dimensions of the toroid core of the balanced choke.

Now referring to FIG. 8b, there is shown an illustrative embodiment of the dimensions of the toroid core of the balanced choke.

Figure 8C:
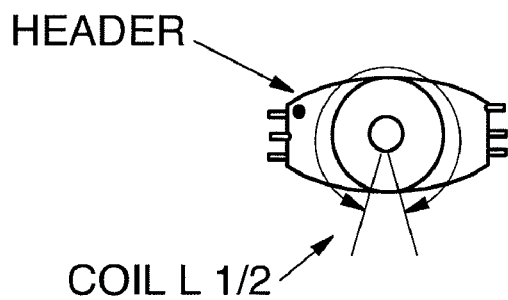
FIG. 8c is a diagram which shows an embodiment of the orientation of the balanced choke.

Referring to FIG. 8c, there is shown an orientation of the inductor L1/2 of the balanced choke.

Figure 8D:
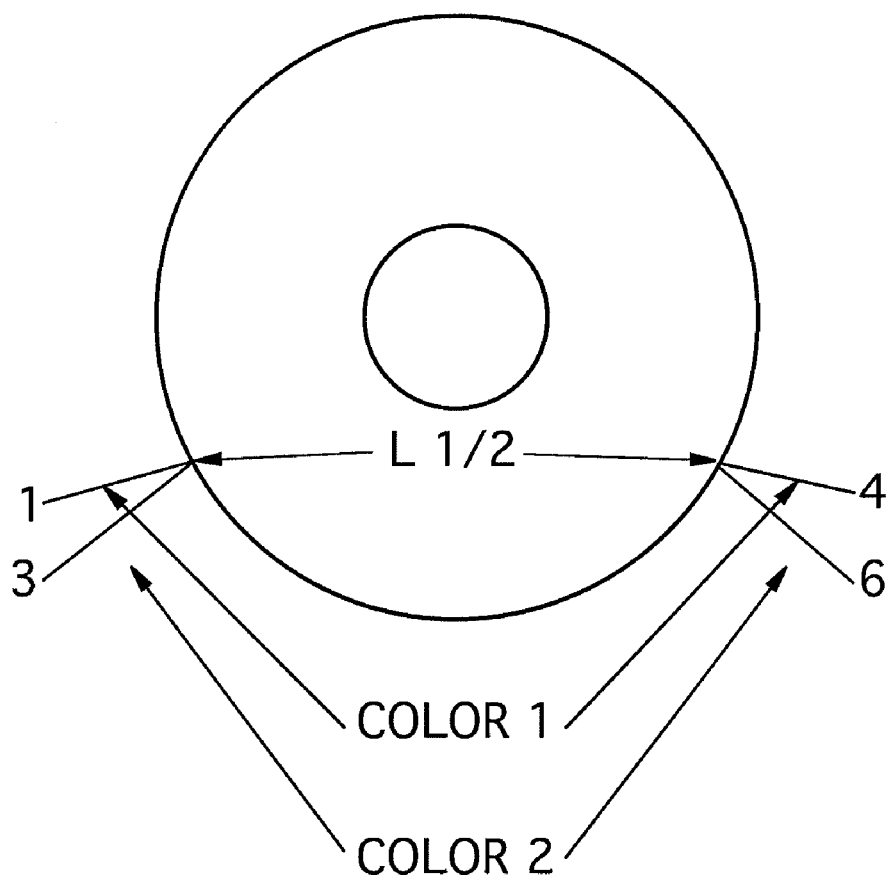
FIG. 8d shows header and pin identification of an embodiment of the balanced choke.
Figure 8D:
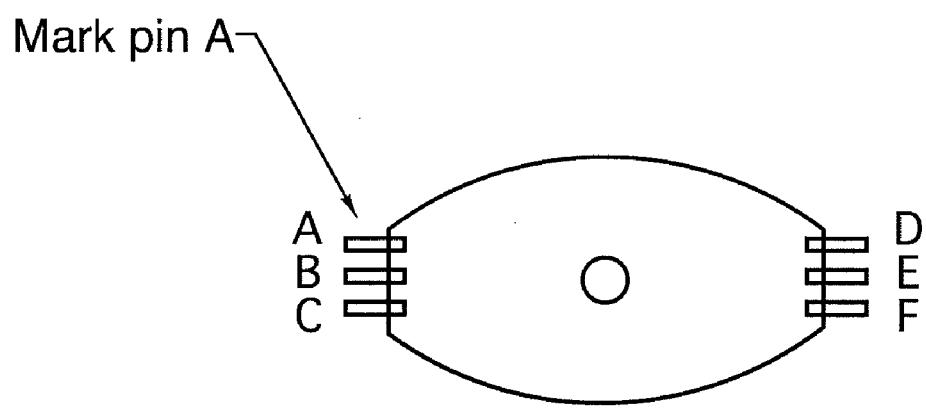

FIG. 8d shows header and pin identification of the balanced choke according to one embodiment. In this embodiment, header pin A corresponds to inductor termination 1, while header pin C corresponds to inductor termination 3. Header pin D corresponds to inductor termination 4, while header pin F corresponds to inductor termination 6.

Figure 9A:
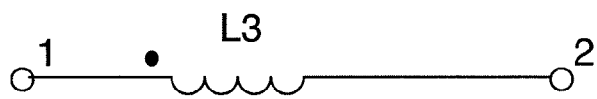
FIG. 9a is a schematic diagram of an inductor according to an embodiment.

Now referring to FIG. 9a, there is shown a schematic diagram of inductors 482, 486 according to one embodiment.

It will be appreciated that the windings of the inductors 482, 486 are as follows.

| | Coil # | #Turns | Wire size | Resistance | Winding style | start | end |
|---|---|---|---|---|---|---|---|
| 1 | L1 = 250 uH Typ. | 8 | 26 AWG | Near 0 ohm | Solid wire L1 | 0° | 270° |

It will be appreciated that each of the inductors 482, 486 comprises a wire enameled transformer type having a single core in one embodiment. Moreover it will be appreciated that in one embodiment each turn of wire of L1 does not overlap the next one.

It will be further appreciated that in this embodiment the windings are laid along the radius of the ferrite core and are spread uniformly in a dedicated sector. Still in this embodiment, no header is used and no varnish is used for windings impregnation.

It will be appreciated that the tolerance is plus or minus 10 percent, if not indicated otherwise. Maximum current through the windings is 1 A. It will be appreciated that all materials withstand a temperature of 260° C. of multiple cycle thermal process in one embodiment. The inductor is further compliant with RoHS as well as with UL94V0 flammability rating.

It will be further appreciated that in this embodiment, no glue is used at any point of the structure of the inductor but Epoxy Silicone RTV KE441W, 105° C. from XIONGGANG or equivalent may be used. Other methods to secure the windings such as tie wraps, shrink tube, self adhesive tape may be used.

Figure 9B:
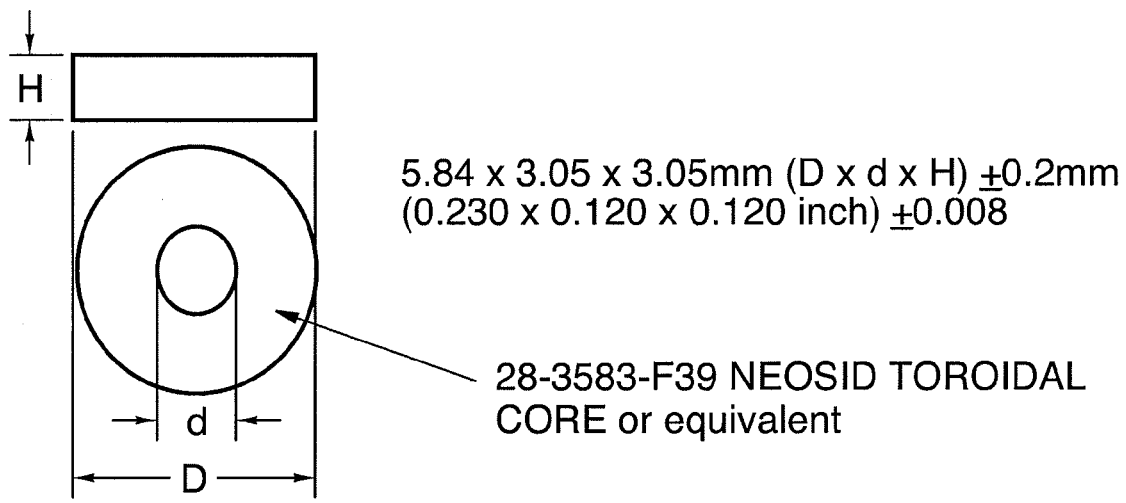
FIG. 9b is a schematic diagram which shows an embodiment of the dimensions of the toroid core of the inductor.

Now referring to FIG. 9b, there is shown an embodiment of the dimensions of the toroid core of the inductor according to one embodiment.

Figure 9C:
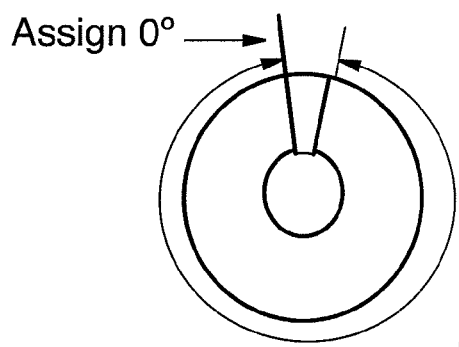
FIG. 9c is a schematic diagram which shows an embodiment of the single phase of wiring layout of the inductor.

FIG. 9c is a schematic which shows one embodiment of the single phase of wiring layout of the inductor.

Figure 9D:
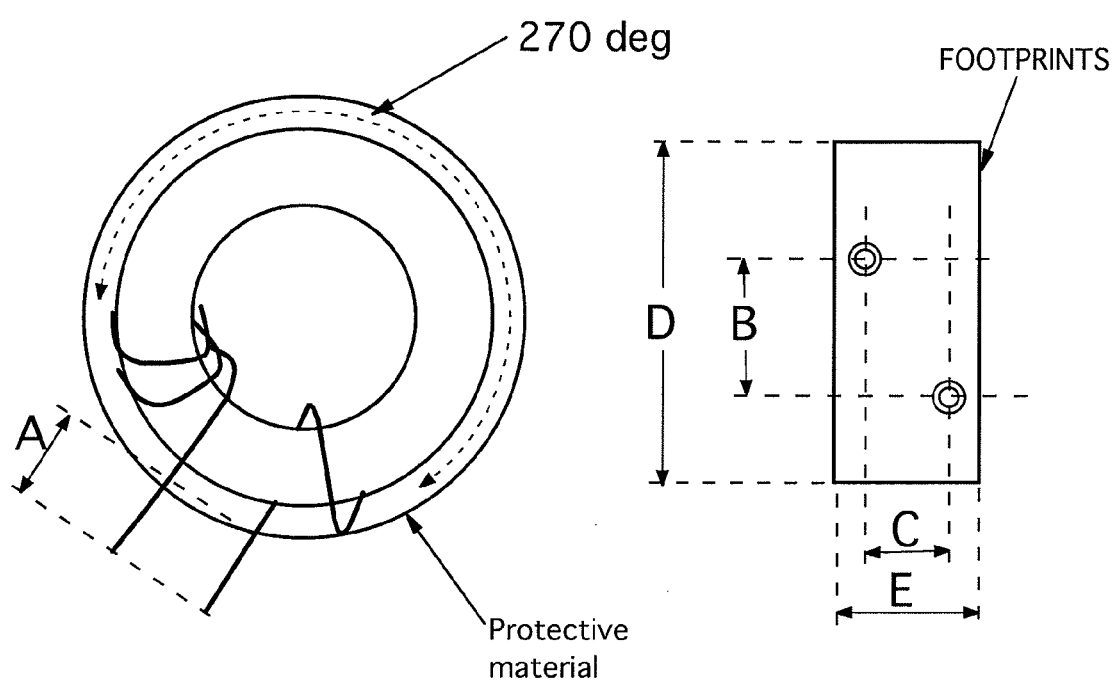
FIG. 9d is a schematic diagram which shows additional details of an embodiment of the inductor.

Finally, FIG. 9d shows details of one embodiment of the inductor. In this embodiment, A is 0.2" long, tinned. D is equal to 0.3", while B and E are equal to 0.2". C is equal to 0.1". It will be appreciated that no glue or epoxy is applied on the windings in process of manufacturing. Still in this embodiment, the coil is wrapped around using self adhesive tape or hear shrink tube to protect the windings.

It will be appreciated that the transmitter and the receiver are connected using a passive transmitter adapter 402, a passive receiver adapter 406 and, in one embodiment, a structured cable UTP cat 5, or higher category, in which the five, above-mentioned and unbalanced independent signals are transmitted over distances above those recommended by manufacturers which is of great advantage over the prior art. The skilled addressee will further appreciate that the transmitting is performed with the removal of harmful distortions.

In fact, the skilled addressee will appreciate that the embodiment disclosed above is of great advantage since it removes the needs for using five coaxial cables, each one for transmitting one of the signals, between a transmitter and a receiver for distances over 200 feet. The skilled addressee will appreciate that this is of great advantage over the prior art because of the time and resources associated with the installation of five coaxial cables. In fact such embodiment disclosed enables to reduce the installation costs associated with such system, it further facilitates moves and changes in the system since it is integrated.

It will be appreciated by the skilled addressee that in an alternative embodiment, separate adapters may be used for handling video signals and audio signals. In such embodiment, two separate UTP cat 5 cables may be required.

It will be appreciated that the balun transformers are advantageously used as a countermeasure against distortions caused by the EMI between the transmitter and the receiver.

Moreover, it will be further appreciated that the embodiment disclosed enables the providing of a countermeasure against the distortions caused by the different ground levels between the transmitter and the receiver.

It will be appreciated that the passive transmitter adapter 402 is capable of converting all unbalanced audio/video signals into balanced audio/video signals. Moreover, it will be appreciated that an additional channel is created on balanced side so two balanced channels may transmit content of three balanced channels. It will still be appreciated that 1 1/2 pair of UTP cable is used for the audio transmission instead of two pairs. The skilled addressee will appreciate that the other half of the pair is used for ground loop connectivity.

It will be appreciated that the embodiment disclosed may be advantageously used for instance when a UTP cat 5 cabling network is already structurally available in an office or home setting for instance. It will be further appreciated that an advantage over the prior art is that the passive transmitter adapter 402 and the passive receiver adapter 406 disclosed herein use a single UTP cable for the transmission of all five channels.

It will be further appreciated that the passive receiver adapter 406 provides a conversion of all balanced audio/video signals into unbalanced audio/video signals. The passive receiver adapter 406 is further capable of processing the video signals to provide the three video channels in unbalanced format. Finally it will be appreciated that the passive receiver adapter 406 is used for substituting the local receiver ground level by the transmitter ground level thereby removing the ground loops variable voltage.

Figure 10:
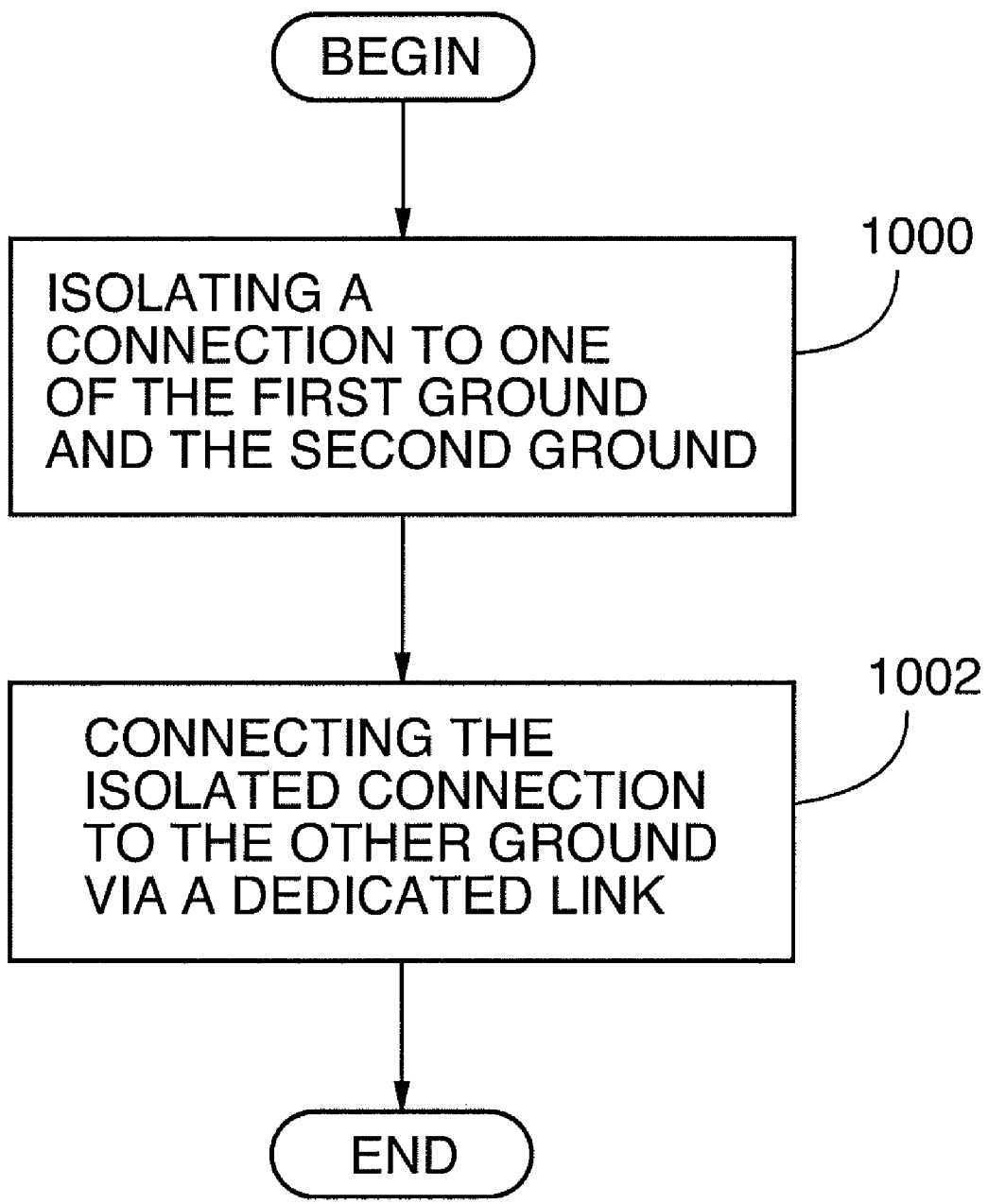
FIG. 10 is a flowchart which shows an embodiment of a method for reducing distortions originating from a balanced link between a transmitter and a receiver.

Now referring to FIG. 10, there is shown one embodiment of a method for reducing distortions originating from a balanced link between a video transmitter connected to a first ground and a video receiver connected to a second ground.

According to processing step 1000, a connection to one of the first ground and the second ground is isolated.

According to processing step 1002, the isolated connection is connected to the other ground via a dedicated link.

As mentioned above, it will be appreciated that the balanced link is used to transmit an audio/video signal in one embodiment. Moreover, in one embodiment, the balanced link comprises a plurality of wires, each of the plurality of wires being used for transmitting a corresponding audio/video component signal.

It will be appreciated that in one embodiment, the connecting of the isolated connection to the other ground via a dedicated link comprises selecting a given wire from the plurality of wires; the given wire being used for transmitting a given audio/video component signal, injecting the given audio/video component signal into another wire from the plurality of wires and using the specifically created link or wire to connect the isolated connection to the other ground.

It will be further appreciated that the given wire selected is one of two wires used for transmitting a first audio component signal.

Moreover, it will be further appreciated that the other wire is one of the two wires used for transmitting a second audio component signal in one embodiment and that the injecting may be performed in one of the two wires used for transmitting the second audio component signal as explained further above.

It will be appreciated by the skilled addressee that the embodiment disclosed is of great advantage since it helps reducing the cost of an Audio/Video system installation.

What is claimed is:

1. A method for reducing distortions originating from a balanced link between a transmitter connected to a first ground and a receiver connected to a second ground, the method comprising:
   isolating a connection to one of the first ground and the second ground; and
   connecting the isolated connection to the other ground via a dedicated link.

2. The method as claimed in claim 1, wherein said transmitter is an audio/video transmitter, further wherein said receiver is an audio/video receiver and further wherein said balanced link is used to transmit an audio/video signal.

3. The method as claimed in claim 2, wherein said balanced link comprises a plurality of wires, each of said plurality of wires being used for transmitting a corresponding audio/video component signal, further wherein the connecting of the isolated connection to the other ground via a dedicated link comprises:
   selecting a given wire from the plurality of wires; said given wire being used for transmitting a given audio/video component signal;
   injecting the given audio/video component signal into another wire from the plurality-wires; and
   using the selected given wire to connect the isolated connection to the other ground.

4. The method as claimed in claim 3, wherein the given wire selected is one of two wires used for transmitting a first audio component signal.

5. The method as claimed in claim 4, wherein the other wire is one of two wires used for transmitting a second audio component signal, further wherein the injecting is performed in one of the two wires used for transmitting the second audio component signal.

6. A passive adapter for reducing distortions originating from a balanced link between an audio/video transmitter connected to a first ground and an audio/video receiver connected to a second ground, the passive adapter comprising:
   a first unbalanced video terminal;
   a second unbalanced video terminal;
   a third unbalanced video terminal;
   a first unbalanced audio terminal;
   a second unbalanced audio terminal;
   a first balanced choke having a first end and a second end;
   a first balun transformer having a first input operatively connected to the first unbalanced video terminal, a first output operatively connected to the first end of the first balanced choke and a second output operatively connected to the second end of the first balanced choke;
   a second balanced choke having a first end and a second end;
   a second balun transformer having a first input connected to the second unbalanced video terminal, a first output operatively connected to the first end of the second balanced choke and a second output operatively connected to the second end of the second balanced choke;
   a third balun transformer having a first input operatively connected to the third unbalanced video terminal, a first output operatively connected to the first balanced choke at a given location and a second output operatively connected to the second choke at a given location;
   a first audio transformer having a first input operatively connected to the first unbalanced audio terminal, a first output and a second output;
   a second audio transformer having a first input operatively connected to the second unbalanced audio terminal, a first output and a second output, said second output of said second audio transformer being operatively connected to said second output of said first audio transformer; and
   a plurality of connecting ends for connecting said passive adapter to said balanced link, the plurality of connecting ends being connected to the first output of the first balun transformer, the second output of the first balun transformer, the first output of the second balun transformer, the second output of the second balun transformer, the first output of the third balun transformer, the second output of the third balun transformer, the first output of the first audio transformer, the second output of the first audio transformer, the first output of the second audio transformer and a ground signal level.

7. The passive adapter as claimed in claim 6, wherein said first unbalanced video terminal receives a first video component signal from said audio/video transmitter; further wherein said second unbalanced video terminal receives a second video component signal from said audio/video transmitter; further wherein said third unbalanced video terminal receives a third video component signal from said audio/video transmitter; further wherein said first unbalanced audio terminal receives a first audio component signal from said audio/video transmitter and further wherein said second unbalanced audio terminal receives a second audio component signal from said audio/video transmitter.

8. The passive adapter as claimed in claim 7, wherein said first video component signal is used to carry color red code, said second video component signal is used to carry color green code and said third video component signal is used to carry color blue code, further wherein said first audio component signal is used to carry left audio channel code and said right audio component signal is used to carry right audio channel code.

9. The passive adapter as claimed in claim 6, wherein each of the first unbalanced video terminal, the second unbalanced video terminal, the third unbalanced video terminal, the first unbalanced audio terminal and the second unbalanced audio terminal comprises an RCA connector.

10. The passive adapter as claimed in claim 6, wherein said plurality of connecting ends comprises an RJ 45 jack for connecting said passive adapter to said balanced link.

11. The passive adapter as claimed in claim 6, wherein said first unbalanced video terminal provides a first video component signal to said audio/video receiver; further wherein said second unbalanced video terminal provides a second video component signal to said audio/video receiver; further wherein said third unbalanced video terminal provides a third video component signal to said audio/video receiver; further wherein said first unbalanced audio terminal provides a first audio component signal to said audio/video receiver and further wherein said second unbalanced audio terminal provides a second audio component signal to said audio/video receiver.

12. The passive adapter as claimed in claim 6, wherein each of said first balun transformer, said second balun transformer and said third balun transformer has an inductance of 20 mH.

13. The passive adapter as claimed in claim 6, wherein each of the first balanced choke and the second balanced choke has an inductance of 100 mH minimum.

14. The passive adapter as claimed in claim 6, wherein said first output of said third balun transformer is connected at the middle of the first balanced choke; further wherein the second output of the third balun transformer is connected at the middle of the second balanced choke.

15. A system for reducing distortions between an audio/video transmitter and an audio/video receiver, said system comprising:
   a first passive adapter as claimed in claim 6, said first passive adapter being operatively connected to the audio/video transmitter;
   a second passive adapter as claimed in claim 6, said second passive adapter being operatively connected to the audio/video receiver; and
   a balanced link to be connected to the first passive adapter and to the second passive adapter.

16. The system as claimed in claim 15, wherein said balanced link comprises a plurality of wires.

17. The system as claimed in claim 16, wherein said plurality of wires is provided in an Unshielded Twisted Pair (UTP) cable.

18. A passive adapter for reducing distortions originating from a balanced link between an audio/video transmitter connected to a first ground and an audio/video receiver connected to a second ground, the passive adapter comprising:
   a first unbalanced video terminal;
   a second unbalanced video terminal;
   a third unbalanced video terminal;
   a first unbalanced audio terminal;
   a second unbalanced audio terminal;
   a first balanced choke having a first end and a second end;
   a first balun transformer having a first input operatively connected to the first unbalanced video terminal, a first output and a second output;
   an inductor having a first end and a second end, said second end being operatively connected to a ground;
   a second balun transformer having a first input connected to the second unbalanced video terminal, a first output operatively connected to the first end of the first balanced choke and a second output operatively connected to the second end of the first balanced choke and to the first end of the inductor;
   a third balun transformer having a first input operatively connected to the third unbalanced video terminal, a first output operatively connected to the first balanced choke at a given location and a second output;
   a first audio transformer having a first input operatively connected to the first unbalanced audio terminal, a first output and a second output;
   a second audio transformer having a first input operatively connected to the second unbalanced audio terminal, a first output and a second output, said second output of said second audio transformer being operatively connected to said second output of said first audio transformer; and
   a plurality of connecting ends for connecting, said passive adapter to said balanced link, the plurality of connecting ends being connected to the first output of the first balun transformer, the second output of the first balun transformer, the first output of the second balun transformer, the second output of the second balun transformer, the first output of the third balun transformer, the second output of the third balun transformer, the first output of the first audio transformer, the second output of the first audio transformer, the first output of the second audio transformer and second ground.

* * * * *